United States Patent
Morassutto et al.

(10) Patent No.: US 10,161,973 B2
(45) Date of Patent: Dec. 25, 2018

(54) SYSTEM AND METHOD FOR MEASURING ACTIVE POWER IN A LOAD WITHOUT A LOAD VOLTAGE

(71) Applicants: Loris Morassutto, Saint Didier de Formans (FR); Joe Cottam, Vaugneray (FR); Gerard Ledee, La Tour de Salvagny (FR)

(72) Inventors: Loris Morassutto, Saint Didier de Formans (FR); Joe Cottam, Vaugneray (FR); Gerard Ledee, La Tour de Salvagny (FR)

(73) Assignee: Eurotherm Ltd, London (GB)

( * ) Notice: Subject to any disclaimer, the term of this patent is extended or adjusted under 35 U.S.C. 154(b) by 822 days.

(21) Appl. No.: 14/261,665

(22) Filed: Apr. 25, 2014

(65) Prior Publication Data
US 2015/0309094 A1    Oct. 29, 2015

(51) Int. Cl.
  *G01R 21/06* (2006.01)
  *G01R 21/133* (2006.01)
  *G01R 35/04* (2006.01)

(52) U.S. Cl.
  CPC ......... *G01R 21/06* (2013.01); *G01R 21/1331* (2013.01); *G01R 21/133* (2013.01); *G01R 35/04* (2013.01)

(58) Field of Classification Search
  CPC ...... G01R 21/133; G01R 22/10; G01R 35/04; G01R 21/06; G01R 22/00
  USPC ......................................................... 324/142
  See application file for complete search history.

(56) References Cited

U.S. PATENT DOCUMENTS

| | | | | |
|---|---|---|---|---|
| 4,056,774 A | * | 11/1977 | Shum | G01R 21/133 324/142 |
| 4,077,061 A | * | 2/1978 | Johnston | G01R 21/133 702/58 |
| 5,243,536 A | * | 9/1993 | Bradford | G01R 21/003 324/142 |
| 5,315,531 A | * | 5/1994 | Oravetz | G01R 21/133 324/142 |
| 5,450,007 A | * | 9/1995 | Payne | G01R 19/252 324/141 |
| 6,501,257 B1 | * | 12/2002 | Elmore | G01R 35/04 324/142 |
| 6,657,424 B1 | * | 12/2003 | Voisine | G01R 21/133 324/134 |
| 6,694,270 B2 | * | 2/2004 | Hart | G01D 4/004 700/297 |
| 6,982,650 B1 | * | 1/2006 | Asplund | G01R 21/133 324/117 R |

(Continued)

FOREIGN PATENT DOCUMENTS

WO    WO 2010/142961 A1    12/2010

*Primary Examiner* — Christopher McAndrew
(74) *Attorney, Agent, or Firm* — Reinhart Boerner Van Deuren P.C.

(57) ABSTRACT

A system for use in determining the active power used in an electrical circuit is provided. The system includes an electrical circuit comprising both reactive and resistive components, and a digital processor connected to the electrical circuit, the digital processor configured to collect synchronized samples of a line voltage across the electrical circuit and a load current through the electrical circuit. The digital processor processes the synchronized samples of the line voltage and the load current to determine an active power used in the electrical circuit.

20 Claims, 1 Drawing Sheet

(56) References Cited

U.S. PATENT DOCUMENTS

| | | | | |
|---|---|---|---|---|
| 6,992,475 B2* | 1/2006 | Perner | ............... | G01R 31/3008 |
| | | | | 324/754.19 |
| 7,511,472 B1* | 3/2009 | Xia | ............... | G01R 21/133 |
| | | | | 323/282 |
| 7,541,800 B2* | 6/2009 | Lee, Jr. | ............... | G01R 19/2513 |
| | | | | 324/127 |
| 7,714,735 B2* | 5/2010 | Rockwell | ............... | G01R 19/2513 |
| | | | | 324/126 |
| 7,772,812 B2* | 8/2010 | Shuey | ............... | H02M 7/2176 |
| | | | | 323/224 |
| 8,049,642 B2* | 11/2011 | Makinson | ............... | G01D 4/004 |
| | | | | 324/110 |
| 8,587,445 B2* | 11/2013 | Rockwell | ............... | G01R 19/2513 |
| | | | | 324/126 |
| 2004/0078154 A1* | 4/2004 | Hunter | ............... | G01R 21/133 |
| | | | | 702/61 |
| 2004/0133370 A1* | 7/2004 | Lavoie | ............... | G06F 1/12 |
| | | | | 702/60 |
| 2008/0068005 A1* | 3/2008 | Briese | ............... | G01D 3/08 |
| | | | | 324/142 |
| 2012/0062249 A1* | 3/2012 | Shamir | ............... | G01R 15/186 |
| | | | | 324/679 |

\* cited by examiner

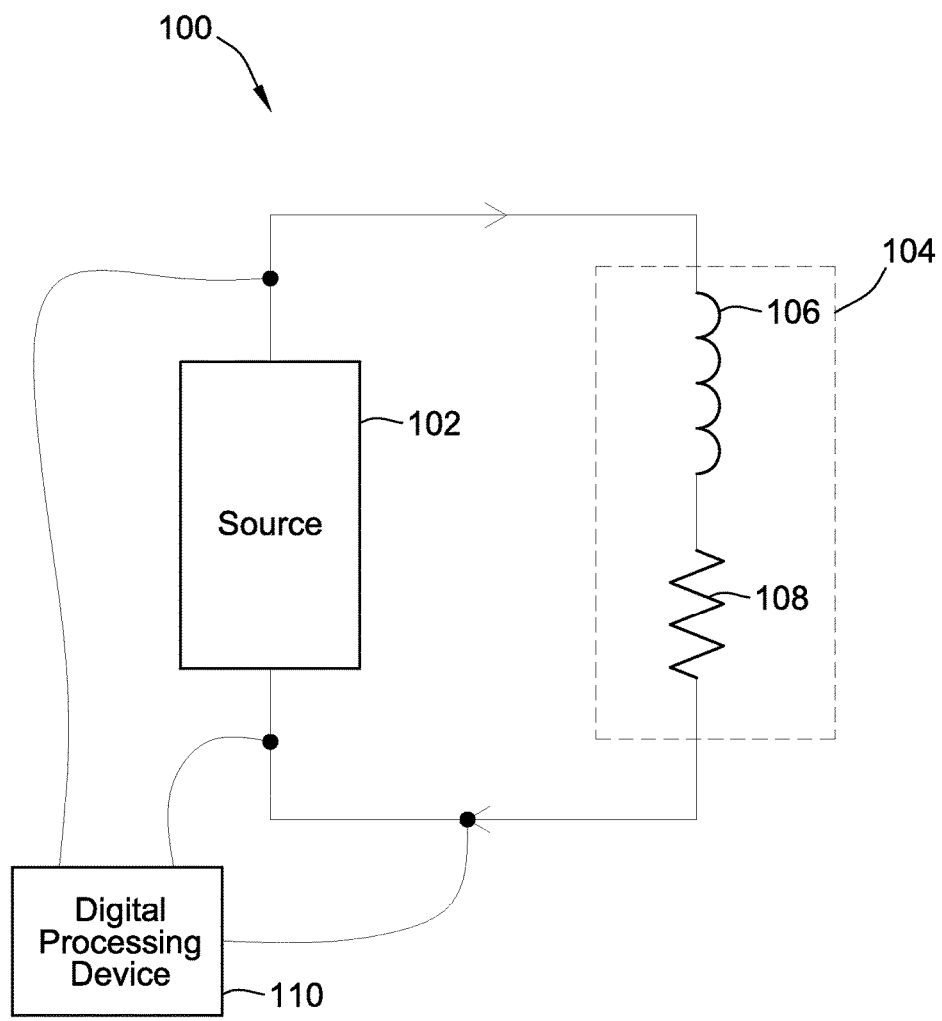

SYSTEM AND METHOD FOR MEASURING ACTIVE POWER IN A LOAD WITHOUT A LOAD VOLTAGE

FIELD OF THE INVENTION

This invention generally relates to a system and method for measuring power.

BACKGROUND OF THE INVENTION

Measuring the power of an electrical circuit is a vital goal in many different electrical applications. Electric power is typically defined as a rate at which electric energy is transferred by an electric circuit. When an electric charge moves from a high voltage level to a low voltage level through a potential difference, electric energy is transferred and power is consumed. In many appliances, the power is converted into other forms, like light and heat in a light bulb, or kinetic energy in an electric motor. Electric power is typically calculated by multiplying the voltage by the current.

There are three different types of power to be measured in a circuit that contains both resistive and reactive components. Active power is a measure of the power that is dissipated by the resistive components of a circuit. The reactive components of an electric circuit do not actually dissipate any power, but they do give the impression of power dissipation in the form of reactive power. The combination of reactive power and active power is called apparent power, and it is the product of a circuit's voltage and current. The three types of power may relate to each other in a trigonometric way represented by a right triangle with active power and reactive power on the smaller sides and apparent power on the hypotenuse.

Measuring active power in a circuit is desirable due to the fact that active power represents the actual power dissipated. Active power represents the capacity of the circuit to perform work in a period of time. In using a circuit to perform work, knowing the active power of the circuit is valuable for many reasons, including being able to predict behavior of the circuit and control the circuit accurately.

The process of measuring active power in a circuit with both resistive and reactive components can be challenging. When the circuit is powered by an alternating current power source, the presence of reactive components causes the cycle of the current to be out of phase with the cycle of the voltage. Normally, to provide a measurement of active power, there are three required measurements: the line voltage, the load current, and the load voltage. This can be difficult to do, based on the difference in phase between the load voltage and load current. Measuring the load voltage generally requires an increase in the expense and complexity of the electrical circuit. A system for measuring active power that does not require measuring the load voltage would significantly simplify the process of measuring active power, and provide an advantage over conventional systems and methods of power measurement.

Embodiments of the invention provide such a system for measuring active power that does not require measuring the load voltage. These and other advantages of the invention, as well as additional inventive features, will be apparent from the description of the invention provided herein.

BRIEF SUMMARY OF THE INVENTION

In accordance with embodiments of the present invention, an active power measuring system and method which determines active power based on measuring the line voltage and the load current is provided. In a particular embodiment of the invention, a system for use in determining the active power used in an electrical circuit includes a measurement means capable of being connected to an electrical circuit and sampling the line voltage and load current of the electrical circuit. The system also includes a digital processing device coupled to the measurement means that receives the samples of the line voltage and load current and processes the samples to determine the active power used in the electrical circuit, without sampling a load voltage.

Another embodiment of the invention is a method for determining the active power used in an electrical circuit. The method includes sampling the line voltage and the load current of the electrical circuit. The method also includes digitally processing the samples of the line voltage and load current to determine the active power used in the electrical circuit.

Embodiments of the method include digitally processing a selected set of samples to determine the active power used in the electrical circuit, wherein the set of samples is selected based on a threshold level of a measured value. The method may also include selecting the set of samples based on a minimum threshold level of the measured load current. The method may include synchronizing the sampling of the line voltage and the load current such that line voltage samples and the load current samples are taken at the same time. In an alternate embodiment of the invention, the sampling of the line voltage and the load current are taken at different times. The method may further include multiplying the synchronized samples of the line voltage and the load current, and summing the products over time to determine the active power.

In a particular embodiment, the method further includes calculating an RMS value for the load voltage using values for the sampled load current, and the active power determined using the method described above.

Another embodiment of the invention is a system for use in determining the load voltage across a resistive portion of an electrical circuit. The system includes a measurement means capable of being connected to an electrical circuit and sampling the line voltage and load current of the electrical circuit. The system also includes a digital processing device coupled to the measurement means that receives the samples of the line voltage and load current and processes the samples to determine the load voltage across the resistive portion of the electrical circuit.

In another aspect, embodiments of the invention provide a system for use in determining the active power used in an electrical circuit is provided. The system includes an electrical circuit comprising both reactive and resistive components, and a digital processor connected to the electrical circuit, the digital processor configured to collect synchronized samples of a line voltage across the electrical circuit and a load current through the electrical circuit. The digital processor processes the synchronized samples of the line voltage and the load current to determine an active power used in the electrical circuit, without sampling a load voltage.

In a particular embodiment, the digital processor is programmed to select a set of samples to determine the active power used in the electrical circuit, wherein the set of samples is selected based on a threshold level of a measured value. The digital processor may be programmed to select the set of samples based on a minimum threshold level of the measured load current. In a more particular embodiment, the digital processor may be programmed to select the set of samples where the minimum threshold level of the measured load current is based on a percentage of a full scale measurement of the load current.

In certain embodiments, the digital processor is programmed to synchronize the sampling of the line voltage and the sampling of the load current such that line voltage samples and the load current samples are taken at the same times. The digital processor may be programmed to multiply the synchronized samples of the line voltage and the load current, and to sum the products over time to determine the active power.

In another aspect, embodiments of the invention provide a digital processor device that includes an input circuit for gathering samples of a line voltage across an electrical circuit and samples of a load current through the electrical circuit, a memory device connected to the input circuit that stores gathered samples and contains instructions for processing the gathered samples, and a processing circuit connected to the memory device that executes the instructions using the stored samples to determine the active power used in the electrical circuit, without sampling a load voltage.

In a particular embodiment, the processing circuit is configured to select a set of samples to determine the active power used in the electrical circuit, wherein the set of samples is selected based on a threshold level of a measured value. The processing circuit may be configured to select the set of samples based on a minimum threshold level of the load current. The processing circuit may be further configured to synchronize the sampling of the line voltage and the sampling of the load current such that the line voltage samples and load current samples are taken at the same times.

In an alternate embodiment, the processing circuit is configured to synchronize the sampling of the line voltage and the sampling of the load current such that the line voltage samples and load current samples are taken at different times. Additionally, the processing circuit may be configured to calculate a root-mean-square (RMS) value for load voltage using the determined value for the active power, and the sampled value for the load current.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings:

FIG. 1 is a schematic diagram a circuit for measuring active power, according to an embodiment of the invention.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

One possible approach to simplifying the measurement of active power is to use firing pulses as a "gate" on the line voltage measurement, such that load voltage could be derived. However, while in theory this is possible, in practice this would only work for a resistive load. But in most circumstances, a load will have an inductive component. Thus, a significant error will be introduced into the measurement. The error would be proportional to the inductance of the load. For example, when thyristors are used as the switching device, the thyristor conducts until the current reaches zero. However, due to inductance in the circuit, the current and voltage will not reach zero at the same time.

In accordance with the present invention, a system and method are provided for determining the active power in an electrical circuit with a load made up of resistive and reactive components. Embodiment of the present invention have the advantage of calculating the active power using only the line voltage and the load current, rather than the load voltage, line voltage, and load current. For example, when the switching device is a thyristor, the current measurement taken, in accordance with an embodiment of the invention, provides an image in time of the actual conduction cycle of the thyristor. This allows the user to determine the active power without taking a line voltage measurement, thereby increasing the efficiency and lowering the cost of the measurement apparatus while still providing an accurate measurement of the active power.

FIG. 1 shows a basic circuit diagram of the invention. The electric circuit 100 has a power source 102 and a load 104. The load 104 is made up of a reactive component 106 and a resistive component 108. While the diagram shows only one inductor for the reactive component 106 and one resistor for the resistive component 108, the actual load of the circuit could include many different and complex arrangements of reactive and resistive components. Coupled to the circuit 100 is a digital processing device 110 that does the calculation that is the goal the present invention. The digital processing device 110 is coupled to the circuit 100 in such a way that it can measure the line voltage (the voltage across the power source 102) and the load current (the current flowing through load 104). The digital processing device 110 is coupled to the circuit 100 in a way that it does not affect the function of the circuit 100, but rather just detects the values of the line voltage and the load current.

Because circuit 100 has a reactive component, when the source 102 is providing alternating current (AC) power to the load, the cycle of the load current will lag behind the cycle of the line voltage of the source 102. Additionally, there may be voltage levels at which the load current does not flow at all due to the presence of certain components (for instance, if a thyristor is included in the load). The digital processing device 110 takes synchronized samples of the line voltage and the load current throughout the cycle. The digital processing device 110 combines the samples in such a way that the product of the combination is the active power being used by the load 104. Additionally, the system may also be used to calculate an accurate representation of the voltage across the resistive components in the circuit.

The digital processing device 110 multiplies the synchronized samples of the load current and the line voltage and sums the products over time to determine the active power of the circuit. The digital processing device 110 may have thresholds for the load current or line voltage to determine whether to use a particular sample in the calculation of the active power. For example, the calculation may call for only using samples in which the load current measurement is greater than 0.5% of the full scale of the load current. Thresholds can be used in such a way to increase the accuracy of the calculation of the active power through the system using line voltage samples at moments when the line voltage is a close approximation of the load voltage of the circuit.

Embodiments of the invention provide a system and method to control power delivery by allowing computation of an equivalent RMS voltage across the resistive part of the load. Specifically, the system and method described herein permits the user to measure, and, thus, to control, the active power into an inductive and resistive load, without measuring the actual load voltage.

This may be done using a computation incorporating the sampled load current and line voltage, to derive from this the active power flowing into the load. Because the active power flowing into the load is known, this known value along with the sampled load current can be used to compute the equivalent RMS voltage across the resistive part of the load without measuring the load voltage.

This allows for more direct control of the load voltage, which may be preferable, in certain circumstances, to controlling active power into the load. It is also possible to linearize the overall system, based on the driven load contribution. Often, an electrical system is controlled based on some parameter directly related to active power delivered to the load. However, in some cases, it is advantageous to control the voltage across the load. Though when the load, rather than being simply resistive, has an inductive component as well, this induces non-linearities in the control loop, making the system more difficult to control.

Calculation of the load voltage also allows for precise load-failure detection. Otherwise, some load-related failures could be difficult to detect by the control system because of the inductive nature of the load. However, calculation of the RMS voltage on the equivalent resistive-part of the load is possible as described herein, such that more efficient load monitoring is achievable. Such load monitoring is even more beneficial when direct measurement of the RMS voltage across the load (or across a resistive part of the load) is not physically possible, due to the load structure (e.g., in an induction heating process).

With respect to certain embodiments of the invention, the operating efficiency may be increased when the digital processing device 110 is synchronized to the mains, i.e., incoming power line, frequency. In a particular embodiment, the digital processing device 110 is phase-locked to the mains frequency. This allows for the fastest cycle time with respect to sampling of the line voltage and load current, and calculation of active power and/or load voltage. This synchronization process is described in detail in International Application No. PCT/GB2010/001147, filed on Jun. 11, 2010, and published as WO 2010/142961 A1, the teachings and disclosure of which are incorporated in their entireties herein by reference thereto.

The measurement technique disclosed herein eliminates the need to measure load voltage, and also eliminates the need for the isolation components, such a normally requirement to take a load voltage measurement. As such, measurement devices, constructed in accordance with embodiments of the invention, provide cost advantages over conventional power measurement devices and may lighter and more compact than conventional designs.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A system for use in determining the active power used in an electrical circuit, comprising:
   an electrical circuit comprising both reactive and resistive components;
   a digital processor connected to the electrical circuit, the digital processor configured to collect synchronized samples of a line voltage across the electrical circuit and a load current through the electrical circuit;
   wherein the digital processor processes the synchronized samples of the line voltage and the load current to determine an active power used in the electrical circuit without sampling a load voltage.

2. The system in claim 1, wherein the digital processor is programmed to select a set of samples to determine the active power used in the electrical circuit, wherein the set of samples is selected based on a threshold level of a measured value.

3. The system in claim 2, wherein the digital processor is programmed to select the set of samples based on a minimum threshold level of the measured load current.

4. The system in claim 3, wherein the digital processor is programmed to select the set of samples where the minimum threshold level of the measured load current is based on a percentage of a full scale measurement of the load current.

5. The system in claim 1, wherein the digital processor is programmed to synchronize the sampling of the line voltage and the sampling of the load current such that line voltage samples and the load current samples are taken at the same times.

6. The system in claim 1, wherein the digital processor is programmed to synchronize the sampling of the line voltage and the sampling of the load current such that line voltage samples and the load current samples are taken at different times.

7. The system in claim 1, wherein the digital processor is programmed to calculate an RMS value for load voltage using the determined value for the active power, and the sampled value for the load current.

8. The system in claim 1, wherein the digital processor is configured to synchronize its operation with a mains frequency.

9. A method for determining the active power used in an electrical circuit, the method comprising:
sampling the load current through the electrical circuit;
sampling the line voltage across the electrical circuit; and
digitally processing the samples of the line voltage and the load current to determine an active power used in the electrical circuit without sampling a load voltage;
selecting a set of the samples based on a threshold level of a measured value; and
wherein digitally processing the samples comprises digitally processing the selected set of samples to determine the active power used in the electrical circuit.

10. The method in claim 9, further comprising selecting the set of samples based on a minimum threshold level of the measured load current.

11. The method in claim 9, further comprising synchronizing the sampling of the line voltage and the load current such that line voltage samples and the load current samples are taken at the same time.

12. The method in claim 9, further comprising synchronizing the sampling of the line voltage and the load current such that line voltage samples and the load current samples are taken at different times.

13. The method in claim 9, further comprising calculating an RMS value for load voltage using the determined active power and the sampled load current.

14. The method in claim 9, further comprising synchronizing operation of a processing device with a mains frequency.

15. A digital processor device, comprising:
an input circuit for gathering samples of a line voltage across an electrical circuit and samples of a load current through the electrical circuit;
a memory device connected to the input circuit that stores gathered sample values and contains instructions for processing the gathered sample values; and
a processing circuit connected to the memory device that executes the instructions using the stored sample values to determine the active power used in the electrical circuit without sampling a load voltage.

16. The digital processor device in claim 15, wherein the processing circuit is configured to select a set of sample values to determine the active power used in the electrical circuit, wherein the set of sample values is selected based on a threshold level of a measured value.

17. The digital processor device in claim 16, wherein the processing circuit is configured to select the set of sample values based on a minimum threshold level of the load current.

18. The digital processor device in claim 15, wherein the processing circuit is configured to synchronize the sampling of the line voltage and the sampling of the load current such that the line voltage samples and load current samples are taken at the same times.

19. The digital processor device in claim 15, wherein the processing circuit is configured to synchronize the sampling of the line voltage and the sampling of the load current such that the line voltage samples and load current samples are taken at different times.

20. The digital processor device in claim 15, wherein the processing circuit is configured to calculate an RMS value for load voltage using the determined value for the active power, and the sampled value for the load current.

* * * * *